United States Patent
Katayama et al.

(10) Patent No.: US 11,349,278 B2
(45) Date of Patent: May 31, 2022

(54) STEM FOR SEMICONDUCTOR PACKAGE, AND SEMICONDUCTOR PACKAGE

(71) Applicant: SHINKO ELECTRIC INDUSTRIES CO., LTD., Nagano (JP)

(72) Inventors: Wataru Katayama, Nagano (JP); Ryota Mitsui, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 276 days.

(21) Appl. No.: 16/737,024

(22) Filed: Jan. 8, 2020

(65) Prior Publication Data
US 2020/0227887 A1 Jul. 16, 2020

(30) Foreign Application Priority Data
Jan. 16, 2019 (JP) .............................. JP2019-005116

(51) Int. Cl.
| | |
|---|---|
| *H01S 5/02212* | (2021.01) |
| *H01S 5/0237* | (2021.01) |
| *H01S 5/024* | (2006.01) |
| *H01L 23/29* | (2006.01) |
| *H01L 23/36* | (2006.01) |
| *H01L 23/495* | (2006.01) |
| *H01S 5/02208* | (2021.01) |

(52) U.S. Cl.
CPC ............ *H01S 5/0237* (2021.01); *H01L 23/29* (2013.01); *H01L 23/36* (2013.01); *H01L 23/49541* (2013.01); *H01S 5/02208* (2013.01); *H01S 5/02469* (2013.01)

(58) Field of Classification Search
CPC .............. H01S 5/0237; H01S 5/02208; H01S 5/02469; H01S 5/02212; H01L 23/29; H01L 23/36; H01L 23/49541; H01L 33/48; H01L 23/045
See application file for complete search history.

(56) References Cited

U.S. PATENT DOCUMENTS

| | | |
|---|---|---|
| 8,391,326 B1 | 3/2013 | Tamaya et al. |
| 2005/0130342 A1* | 6/2005 | Zheng ................. H01L 31/0203 438/106 |
| 2016/0190767 A1* | 6/2016 | Okahisa ................ H01S 5/0235 372/43.01 |

FOREIGN PATENT DOCUMENTS

WO     2009/116133     9/2009

* cited by examiner

*Primary Examiner* — Xinning (Tom) Niu
(74) *Attorney, Agent, or Firm* — IPUSA PLLC

(57) ABSTRACT

A stem for a semiconductor package, includes an eyelet having a first surface, a second surface opposite to the first surface, and a through-hole penetrating the eyelet from the first surface to the second surface, a metal base bonded to the second surface of the eyelet so as to cover one end of the through-hole, and a metal block having one end thereof inserted into the through-hole and bonded to the metal base inside the through-hole, and another end projecting from the first surface of the eyelet and including a device mounting surface on which a semiconductor device is mounted. The metal base has a thermal conductivity higher than or equal to a thermal conductivity of the eyelet, and a surface at the one end of the metal block matches the second surface of the eyelet.

20 Claims, 3 Drawing Sheets

STEM FOR SEMICONDUCTOR PACKAGE, AND SEMICONDUCTOR PACKAGE

CROSS-REFERENCE TO RELATED APPLICATION

This application is based upon and claims priority to Japanese Patent Application No. 2019-005116, filed on Jan. 16, 2019, the entire contents of which are incorporated herein by reference.

FIELD

Certain aspects of the embodiments discussed herein are related to a stem for a semiconductor package, and the semiconductor package.

BACKGROUND

A known structure of a stem for a semiconductor package mounted with a light emitting device (or light emitting element), includes a circular plate-shaped eyelet formed with a through-hole, and a first heat sink inserted within the through-hole. The first heat sink is thinner than the eyelet.

According to the above-mentioned stem for the semiconductor package, an upper surface of the first heat sink matches an upper surface of the eyelet, and a lower surface of the first heat sink is dented compared to a lower surface of the eyelet. That is, the lower surface of the first heat sink is located at a level higher than the lower surface of the eyelet. A semiconductor device mounting part, which projects upward from the upper surface of the eyelet, is provided on the upper surface of the first heat sink.

When using the above-mentioned stem for the semiconductor package as a light source module, a second heat sink, having a diameter larger than the diameter of the eyelet, is bonded to the lower surface of the eyelet via a thermally conductive bonding agent, so as to improve the heat dissipation performance. A part of the thermally conductive bonding agent enters inside the through-hole of the eyelet, to improve the bond.

For example, International Publication Pamphlet No. WO2009/116133 describes an example of a laser light source module.

However, in a case where the second heat sink having the diameter larger than the diameter of the eyelet is bonded on the eyelet when using the above-mentioned stem for the semiconductor package as the light source module, it is preferable to improve the heat dissipation performance of the stem itself because the size of the light source module increases.

SUMMARY

Accordingly, it is an object in one aspect of the embodiments to provide a stem for a semiconductor package, and the semiconductor package, which can improve the heat dissipation performance.

According to one aspect of the embodiments, a stem for a semiconductor package, includes an eyelet having a first surface, a second surface opposite to the first surface, and a through-hole penetrating the eyelet from the first surface at a first end thereof to the second surface to a second end thereof; a metal base bonded to the second surface of the eyelet so as to cover the second end of the through-hole; and a metal block having a first end thereof inserted into the through-hole and bonded to the metal base inside the through-hole, and a second end projecting from the first surface of the eyelet, wherein a part of the metal block, projecting from the first surface of the eyelet, includes a device mounting surface on which a semiconductor device is mounted, wherein the metal base has a thermal conductivity that is higher than or equal to a thermal conductivity of the eyelet, and wherein a surface at the first end of the metal block matches the second surface of the eyelet.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
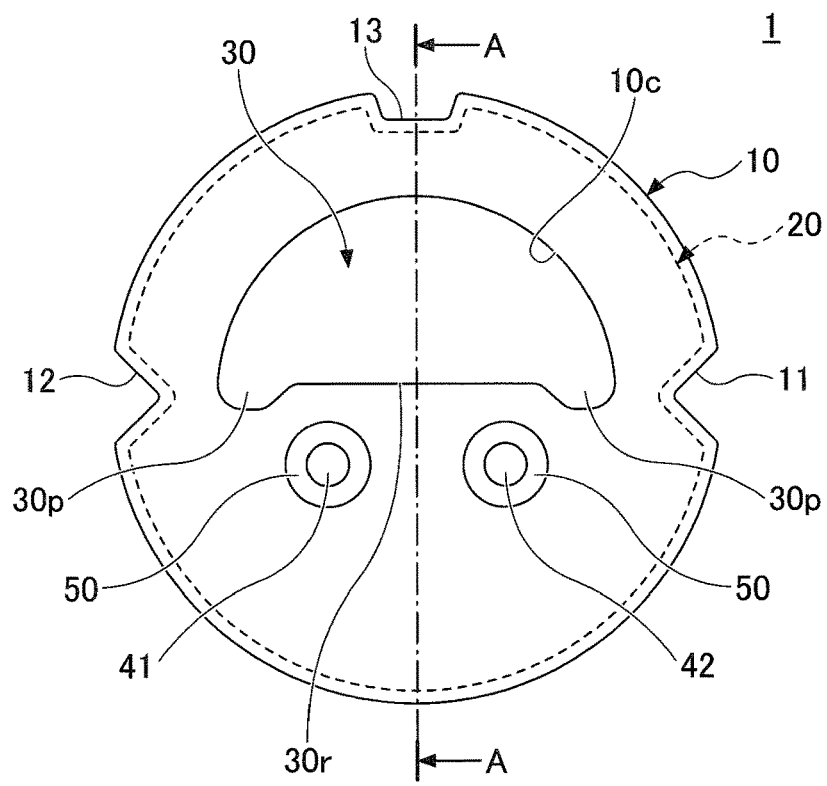
FIG. 1A and FIG. 1B are diagram illustrating an example of a stem for a semiconductor package according to a first embodiment.

Preferred embodiments of the present invention will be described with reference to the accompanying drawings. In the drawings, those parts that are the same are designated by the same reference numerals, and a repeated description of the same parts may be omitted.

A description will now be given of a stem for a semiconductor package, and the semiconductor package, according to each embodiment of to the present invention.

First Embodiment

Figure 1B:
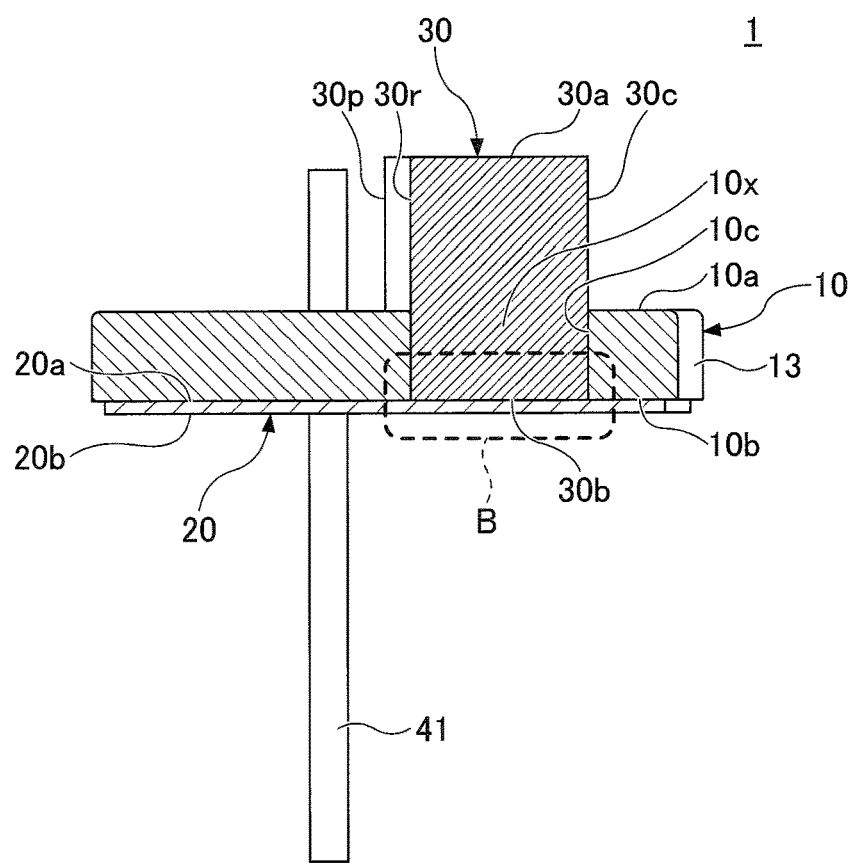

FIG. 1A and FIG. 1B are diagram illustrating an example of a stem for a semiconductor package according to a first embodiment. FIG. 1A is a plan view of the stem, and FIG. 1B is a cross sectional view of the stem along a line A-A in FIG. 1A.

As illustrated in FIG. 1A and FIG. 1B, a stem 1 for the semiconductor package according to the first embodiment includes an eyelet 10, a metal base 20, a metal block 30, a first lead 41, a second lead 42, and an encapsulation part 50.

The eyelet 10 is formed by a circular plate-shaped member. The eyelet 10 includes an upper surface 10a, a lower surface 10b, and a through-hole 10x. The through-hole 10x has an approximately semicircular shape in the plan view, and penetrates the eyelet 10 from the upper surface 10a to the lower surface 10b.

In this specification, the circular plate-shaped member refers to a member having an approximately circular shape in the plan view and a predetermined thickness, and the thickness size with respect to the diameter is not particularly limited. In addition, the circular plate-shaped member includes members partially including a recess, a projection, a through-hole, or the like. Moreover, in this specification, the plan view refers to a view of the upper surface 10a of the eyelet 10 viewed in a normal direction to the upper surface 10a of the eyelet 10. Further, a planar shape of an object refers to a shape of the object viewed from above the object in the normal direction of the upper surface 10a of the eyelet 10.

An outer edge part of the eyelet 10 includes cutouts 11, 12, and 13 that is dented from an outer periphery towards a center in the plan view of the eyelet 10. The cutouts 11, 12, and 13 may be dents having planar shapes that are approximately triangular, approximately rectangular, or the like, for example. In this example, the cutouts 11 and 12 have the approximately triangular planar shape, and the cutout 13 has the approximately rectangular shape. The cutout 11 and the cutout 12 are arranged at diametrically opposite positions of the eyelet 10, for example.

The cutouts 11 and 12 may be used for positioning or the like of a device mounting surface when the stem 1 for the semiconductor package is mounted with a semiconductor device, for example. The cutout 13 may be used for positioning or the like of a rotating direction of the stem 1 for the semiconductor package, for example. The cutouts 11, 12, and 13 may be provided according to the needs.

The diameter of the eyelet 10 is not particularly limited, and may be appropriately determined according to the purpose. The diameter of the eyelet 10 may be 5.6 mm, 9.0 mm, or the like, for example. The thickness of the eyelet 10 is not particularly limited, and may be appropriately determined according to the purpose. The thickness of the eyelet 10 may be approximately 0.5 mm to approximately 3 mm, for example.

The eyelet 10 may be formed from a metal material such as iron, stainless steel, or the like, for example. In addition, the eyelet 10 may be formed from a metal material (so-called clad metal, for example) including a plurality of laminated metal layers, for example. In this case, the plurality of laminated metal layers may be copper layers, iron layers, or the like. The surface of the eyelet 10 may be plated.

The metal base 20 is fortified by a member having an approximately circular planar shape that is slightly smaller than the planar shape of the eyelet 10. In other words, in the plan view, an outline of the metal base 20 is smaller than an outline of the eyelet 10, and the metal base 20 no part that projects from the outline of the eyelet 10. In addition, except for parts where the first lead 41 and the second lead 42 pass through, the metal base 20 includes no through-hole. The metal base 20 is bonded to the lower surface 10b of the eyelet 10, so as to cover one end of the through-hole 10x.

The thickness of the metal base 20 is smaller (that is, thinner) than the thickness of the eyelet 10, and may be approximately 0.1 mm to approximately 0.4 mm, for example. The thermal conductivity of the eyelet 10 is approximately the same as, or higher than, the thermal conductivity of the metal base 20. In a case where the material forming the eyelet 10 is iron, for example, the material forming the metal base 20 may be copper, for example, having the thermal conductivity higher than the thermal conductivity of the eyelet 10. Further, in this case, it is possible to improve the heat dissipation performance of the stem 1 for the semiconductor package.

In a case where the material forming the eyelet 10 is iron, the material forming the metal base 20 may be iron, for example. When the eyelet 10 and the metal base 20 are formed from the same material, the coefficient of thermal expansion becomes the same for the eyelet 10 and the metal base 20. For this reason, it is possible to reduce deformation of the eyelet 10 and the metal base 20 caused by heat, and it is possible to improve the hermetic seal (or airtightness) of the semiconductor package illustrated in FIGS. 3A and 3B which will be described later when manufacturing this semiconductor package including the stem 1 for the semiconductor package mounted with the semiconductor device.

The metal block 30 is formed by a columnar member having an approximately semicircular planar shape that is slightly smaller than the planar shape of the through-hole 10x in the eyelet 10. One end of the metal block 30 is inserted into the through-hole 10x of the eyelet 10, and is bonded to the metal base 20 inside the through-hole 10x. In addition, the other end of the metal block 30 projects from the upper surface 10a of the eyelet 10. A lower surface 30b of the metal block 30 approximately coincides with, or matches, the lower surface 10b of the eyelet 10.

A distance from an upper surface 30a of the metal block 30 to the upper surface 10a of the eyelet 10 (that is, a projecting amount of the metal block 30 from the upper surface 10a of the eyelet 10) may be approximately 2 mm to approximately 3 mm, for example. The metal block 30 may be formed from a material having a thermal conductivity higher than the thermal conductivity of the material forming the eyelet 10. In the case where the material forming the eyelet 10 is iron, the material forming the metal block 30 may be copper, for example.

The metal block 30 forms a part on which the semiconductor device is mounted and fixed, when the stem 1 for the semiconductor package is used for the semiconductor package mounted with the semiconductor device. The metal block 30 also functions as a heat dissipation plate (or heat sink) for dissipating heat generated from the semiconductor device. The part of the metal block 30 projecting from the upper surface 10a of the eyelet 10 includes a device mounting surface 30r where the semiconductor device is mounted. The semiconductor device may be a light emitting device (or light emitting element), such as a laser diode, or the like, for example. The device mounting surface 30r is provided to be approximately perpendicular with respect to the upper surface 10a of the eyelet 10.

In the plan view, both ends of the device mounting surface 30r of the metal block 30 preferably includes a projecting part 30p that projects from a center part of the device mounting surface 30r toward the first lead 41, and a projecting part 30p that projects from the center part of the device mounting surface 30r toward the second lead 42. The volume of the metal block 30 increases by including the projecting parts 30p in the metal block, to improve the heat dissipation performance of the metal block 30.

Figure 2A:
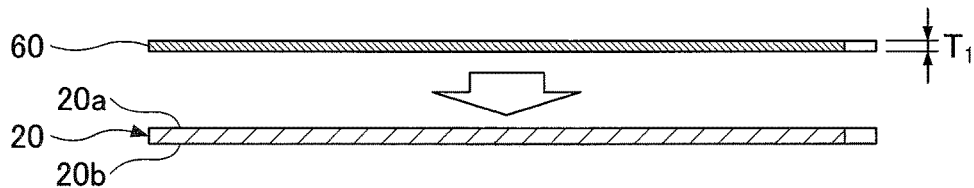
FIG. 2A, FIG. 2B, FIG. 2C, and FIG. 2D are diagrams for explaining processes of bonding an eyelet, a metal base, and a metal block.
Figure 2B:
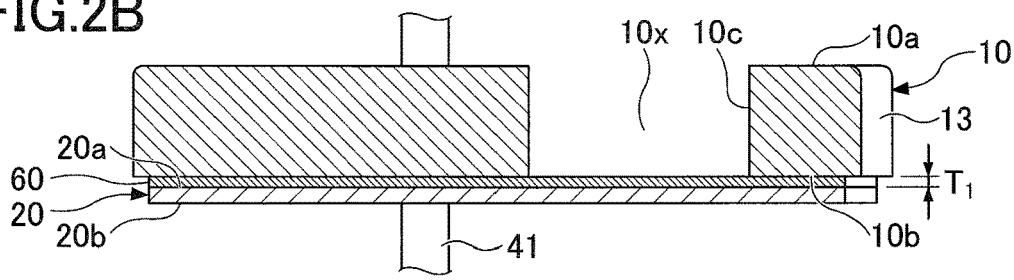
Figure 2C:
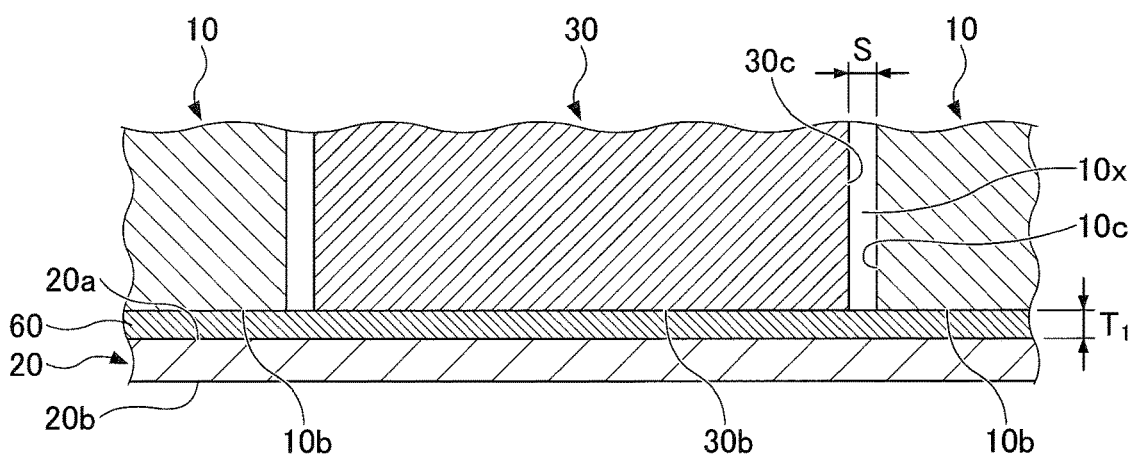
Figure 2D:
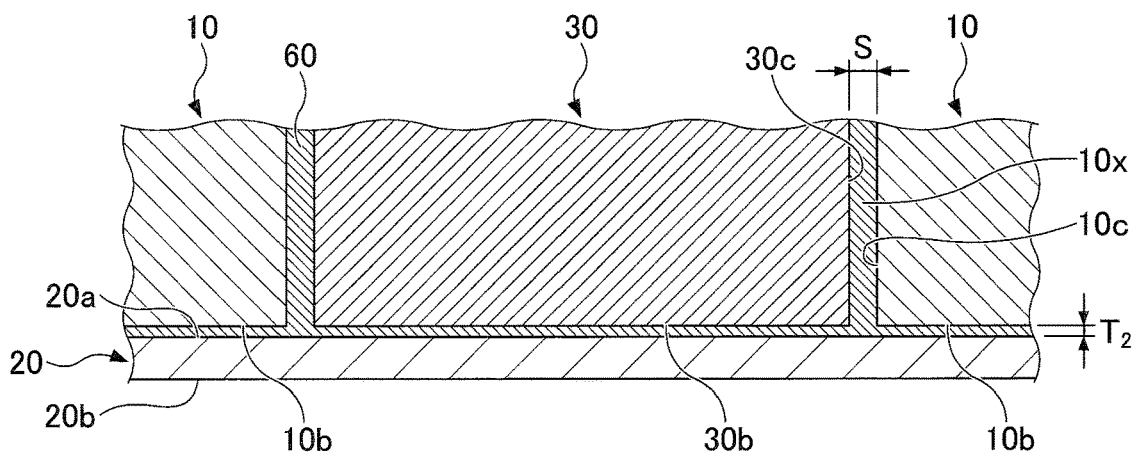

FIG. 2A, FIG. 2B, FIG. 2C, and FIG. 2D are diagrams for explaining processes of bonding the eyelet, the metal base, and the metal block. However, FIG. 2C and FIG. 2D are enlarged views corresponding to a part B surrounded by a doted line in FIG. 1B.

First, as illustrated in FIG. 2A, a metal bonding material 60, having approximately the same shape as the metal base 20 in the plan view, is prepared, and the metal bonding material 60 is arranged on the upper surface 20a of the metal base 20. A thickness $T_1$ of the metal bonding material 60 is approximately 30 μm to approximately 70 μm, for example. Through-holes for inserting the first lead 41 and the second lead 42 are provided in the metal base 20.

The processes of manufacturing the semiconductor package including the stem 1 for the semiconductor package, mounted with the semiconductor device, may include a heat treatment process that heats to approximately 300° C., for example. For this reason, the metal bonding material 60 that bonds the eyelet 10, the metal base 20, and the metal block 30 is preferably selected to a material having a melting point of 350° C. or higher, for example. Examples of the metal bonding material 60 include a silver solder having a melting point of 800° C. or higher, or the like, for example. In FIG. 1A and FIG. 1B, the illustration of the metal bonding material 60 is omitted for the sake of convenience.

Next, as illustrated in FIG. 2B, the eyelet 10 provided with the first lead 41, the second lead 42, and the encapsulation part 50 is prepared, and the eyelet 10 is arranged on the metal bonding material 60. In other words, the eyelet 10 is arranged on the metal base 20 via the metal bonding material 60, so that the metal bonding material 60 is sandwiched between the eyelet 10 and the metal base 20. The lower surface 10b of the eyelet 10 contacts the metal bonding material 60.

Next, as illustrated in FIG. 2C, the metal block 30 is inserted into the through-hole 10x of the eyelet 10. The lower surface 30b of the metal block 30 contacts the metal bonding material 60. Because the thickness $T_1$ of the metal bonding material 60 is approximately constant, the lower surface 30b of the metal block 30 approximately coincides with the lower surface 10b of the eyelet 10. In addition, a gap (or clearance) S formed between a side surface 30c of the metal block 30 and an inner wall surface 10c of the through-hole 10x. The gap S may be approximately 30 μm to approximately 70 μm, for example.

Next, as illustrated in FIG. 2D, the metal bonding material 60 is heated to a high temperature to melt the metal bonding material 60, and the metal bonding material 60 is thereafter solidified. The eyelet 10 and the metal block 30 may be pressed toward the metal base 20 when solidifying the metal bonding material 60.

The metal bonding material 60 at the part sandwiched between the metal base 20 and the eyelet 10, and at the part sandwiched between the metal base 20 and the metal block 30, becomes thin when melted. A thickness $T_2$ of the metal bonding material 60 at the part sandwiched between the metal base 20 and the eyelet 10, and at the part sandwiched between the metal base 20 and the metal block 30, after the solidification may be approximately 10 μm or less, for example. The thickness $T_2$ of the metal bonding material 60 after the solidification may be approximately several μm, for example. Because the thickness $T_2$ of the metal bonding material 60 becomes approximately constant and thin approximately uniformly after the solidification, the lower surface 30b of the metal block 30 approximately coincides with the lower surface 10b of the eyelet 10.

In addition, a part of the metal bonding material 60 that is melted, enters inside the gap S due to capillarity, and solidifies in a state filling the gap S. As a result, the eyelet 10, the metal base 20, and the metal block 30 are bonded together.

Accordingly, the lower surface 30b of the metal block 30 is bonded to the upper surface 20a of the metal base 20 via the metal bonding material 60. In addition, the side surface 30c of the metal block 30 is bonded to the inner wall surface 10c of the through-hole 10x in the eyelet 10 via the metal bonding material 60. Further, the lower surface 10b of the eyelet 10 is bonded to the upper surface 20a of the metal base 20 via the metal bonding material 60.

Returning now to the description of FIG. 1A and FIG. 1B, the first lead 41 and the second lead 42, extending along the respective longitudinal directions, are inserted into the respective through-holes penetrating the eyelet 10 and the metal base 20 along the thickness direction thereof. Peripheries of the first lead 41 and the second lead 42 inside the respective through-holes of the eyelet 10 are encapsulated by the encapsulation part 50. A first part of each of the first lead 41 and the second lead 42 projects from the upper surface 10a of the eyelet 10, and a second part of each of the first lead 41 and the second lead 42 projects from the lower surface 20b of the metal base 20. A projecting amount of the second part of each of the first lead 41 and the second lead 42 projecting from the lower surface 20b of the metal base 20 may be approximately 6 mm to approximately 7 mm, for example.

Each of the first lead 41 and the second lead 42 may be formed from a metal, such as 50%-metal-nickel alloy, kovar, or the like, for example. The encapsulation part 50 may be formed from an insulating material such as a glass material or the like, for example. The first lead and the second lead 42 are electrically connected to the semiconductor device that is mounted on the stem 1 for the semiconductor package, for example. The number of leads may be increased according to specifications of the semiconductor device to be mounted.

According to the stem 1 for the semiconductor package, the metal base 20 having the thermal conductivity approximately the same as or higher than the thermal conductivity of the eyelet 10, is bonded to lower surface 10b of the eyelet 10 so as to cover one end of the through-hole 10x. In addition, one end of the metal block 30, on the side of the lower surface 30b, is inserted into the through-hole 10x and bonded to the metal base 20 inside the through-hole 10x. The other end of the metal block 30, on the side of the upper surface 30a, projects from the upper surface 10a of the eyelet 10. Further, the lower surface 30b of the metal block 30 approximately coincides with the lower surface 10b of the eyelet 10.

According to the structure described heretofore, it is possible to position the lower surface 30b of the metal block 30 close to the metal base 20 which becomes a heat dissipation part when the semiconductor device is mounted on the device mounting surface 30r of the metal block 30. In addition, by inserting the metal block 30 inside the through-hole 10x, it is possible to increase the volume of the metal block 30. As a result, it is possible to improve the heat dissipation performance of the stem 1 for the semiconductor package.

The thickness $T_2$ of the metal bonding material 60 at the part sandwiched between the metal base 20 and the eyelet 10, and at the part sandwiched between the metal base 20 and the metal block 30, is 10 μm or less, and is extremely small. Accordingly, the existence (or provision) of the metal bonding material 60 will not deteriorate the heat dissipation performance of the stem 1 for the semiconductor package.

Second Embodiment

A semiconductor package according to a second embodiment includes the stem for the semiconductor package according to the first embodiment, mounted with a light emitting device that is an example of the semiconductor device. In the second embodiment, those parts that are the same as those corresponding parts of the first embodiment are designated by the same reference numerals, and a repeated description of the same parts may be omitted.

Figure 3A:
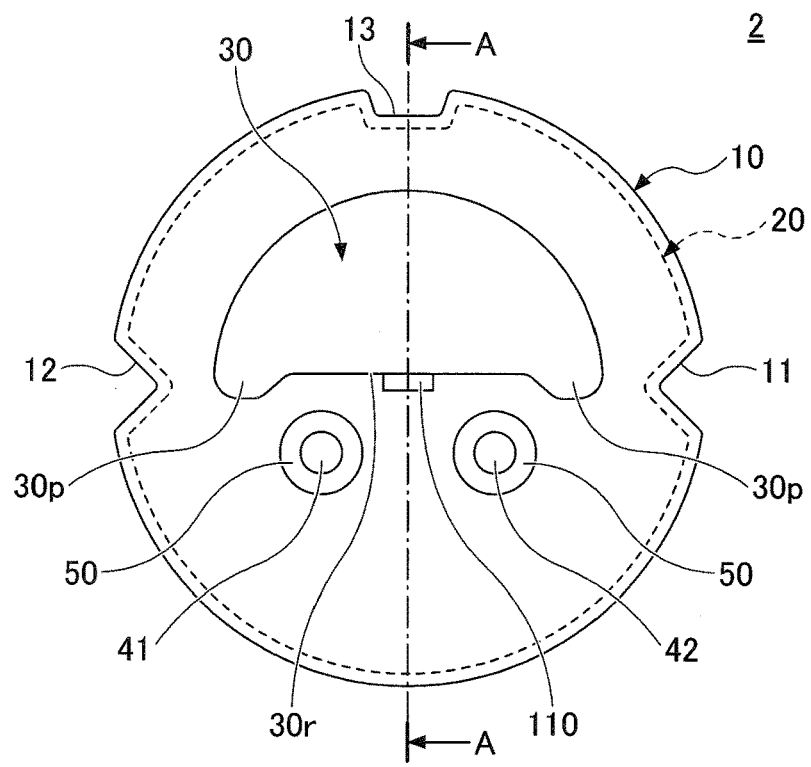
FIG. 3A and FIG. 3B are diagram illustrating an example of the semiconductor package according to a second embodiment.
Figure 3B:
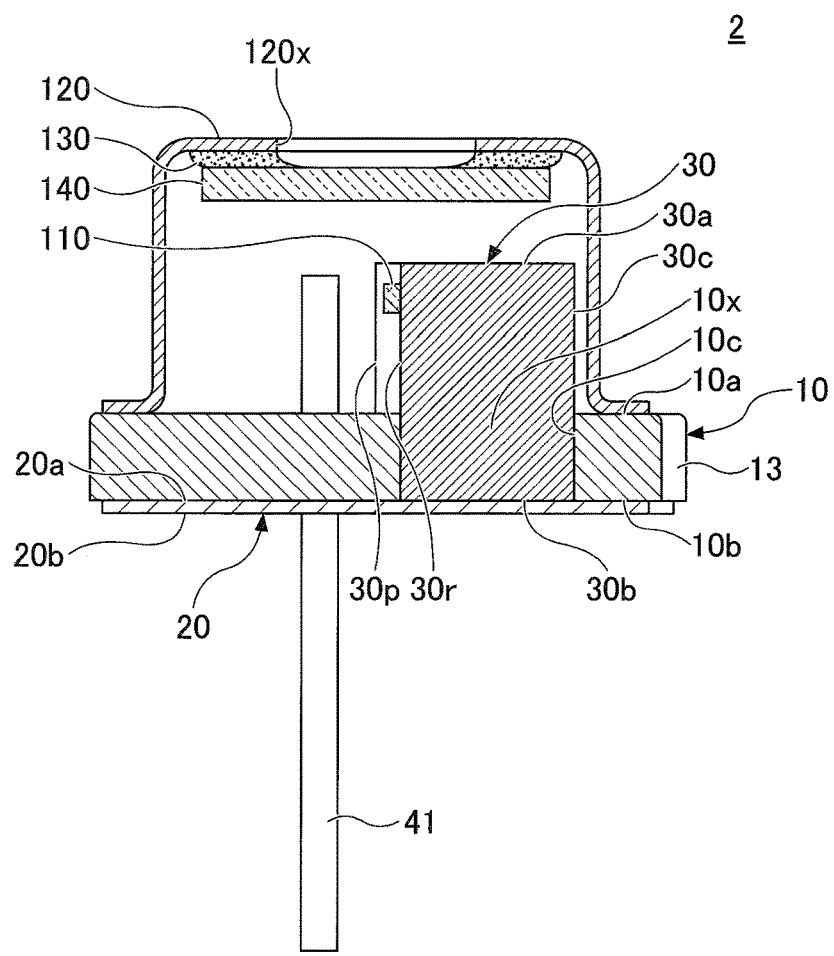

FIG. 3A and FIG. 3B are diagram illustrating an example of the semiconductor package according to the second embodiment. FIG. 3A is a plan view of the semiconductor package, and FIG. 3B is a cross sectional view of the semiconductor package along a line A-A in FIG. 3A.

As illustrated in FIG. 3A and FIG. 3B, a semiconductor package 2 includes the stem 1 for the semiconductor package illustrated in FIG. 1A and FIG. 1B, a light emitting device 110, a cap 120, a bonding agent 130, and a transparent member 140.

The light emitting device 110 may be a semiconductor laser chip that emits laser light having a wavelength of 405 nm, 540 nm, 780 nm, or the like, for example. The light emitting device 110 is fixed to the device mounting surface 30r of the metal block 30, so that one end surface of the light emitting device 110 faces an upper end (that is, the end provided with the transparent member 140), and the other end surface of the light emitting device 110 faces a lower end (that is, the end provided with the upper surface 10a of the eyelet 10). In the semiconductor package 2, the light emitting device 110 is mounted at a position so that, in the plan view, a light emission point of the light emitting device 110 approximately matches a center on the upper surface of the eyelet 10. Electrodes (not illustrated) of the light emitting device 110 are electrically connected to the first lead 41 and the second lead 42 via bonding wires or the like, for example.

The cap 120 is formed from a metal material, such as iron, copper, or the like, for example. In the plan view, an opening (or window) 120x is provided at an approximate center of the cap 120. The transparent member 140 is formed from a transparent material such as glass or the like, for example. The transparent member 140 is bonded to the surface (inner surface) of the cap 120 on the side of the eyelet 10, so as to cover the opening 120x, via the bonding agent 130 that is formed from low-melting glass or the like, for example. The cap 120, having the transparent member 140 bonded thereto via the bonding agent 130, is bonded to a vicinity of the outer edge part of the upper surface 10a of the eyelet 10, by welding or the like, for example. The cap 120 hermetically seals (or encapsulates) the light emitting device 110.

The light (for example, laser beam) emitted from one end surface of the light emitting device 110 is transmitted through the transparent member 140 inside the opening 120x, and is output outside the semiconductor package 2. Of course, the light emitted from the other end surface of the light emitting device 110 may be received by a photodiode or the like, to monitor the amount of light emitted from the light emitting device 110. When an external circuit provided outside the semiconductor package 2 performs a control so that the amount of light received by the photodiode is maintained constant, it is possible to control the amount of light emitted from the semiconductor package 2 regardless of an ambient temperature or the like.

Accordingly, the semiconductor package 2 can be manufactured by mounting the light emitting device 110 on the device mounting surface 30r of the stem 1 for the semiconductor package. Because the heat dissipation performance of the stem 1 for the semiconductor package is superior to the above-mentioned conventional stem for the semiconductor package, the semiconductor package 2 can efficiently dissipate heat generated from the light emitting device 110 outside the semiconductor package 2.

In the second embodiment described above, the light emitting device 110 is mounted on the stem 1 for the semiconductor package. However, the semiconductor device mounted on the stem 1 for the semiconductor package is not limited to the light emitting device 110, and various other semiconductor devices that generate heat may be mounted on the stem 1 for the semiconductor package. In addition, the semiconductor package including the stem 1 for the semiconductor package mounted with the semiconductor device may be used for various kinds of sensor, inflators, or the like, for example.

Although the embodiments are numbered with, for example, "first," or "second," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A stem for a semiconductor package, comprising:
   an eyelet having a first surface, a second surface opposite to the first surface, and a through-hole penetrating the eyelet from the first surface at a first end thereof to the second surface to a second end thereof;
   a metal base bonded to the second surface of the eyelet so as to cover the second end of the through-hole; and
   a metal block having a first end thereof inserted into the through-hole and bonded to the metal base inside the through-hole, and a second end projecting from the first surface of the eyelet,
   wherein a part of the metal block, projecting from the first surface of the eyelet, includes a device mounting surface which is configured to receive a semiconductor device,
   wherein the metal base has a thermal conductivity that is higher than or equal to a thermal conductivity of the eyelet,
   wherein a surface at the first end of the metal block coincides with the second surface of the eyelet, and
   wherein the through-hole in a plan view has a uniform outline from the first surface to the second surface of the eyelet.

2. The stem for the semiconductor package as claimed in claim 1, wherein an outline of the metal base in the plan view is smaller than an outline of the eyelet.

3. The stem for the semiconductor package as claimed in claim 1, further comprising:
   a metal bonding material having a melting point of 350° C. or higher, bonding the eyelet, the metal base, and the metal block together.

4. The stem for the semiconductor package as claimed in claim 3, wherein the metal bonding material is a silver solder.

5. The stem for the semiconductor package as claimed in claim 1, wherein the eyelet and the metal base are made of the same material.

6. The stem for the semiconductor package as claimed in claim 2, wherein the eyelet and the metal base are made of the same material.

7. The stem for the semiconductor package as claimed in claim 3, wherein the eyelet and the metal base are made of the same material.

8. The stem for the semiconductor package as claimed in claim 1, wherein both ends of the device mounting surface of the metal block in the plan view project from a center part of the device mounting surface.

9. The stem for the semiconductor package as claimed in claim 2, wherein both ends of the device mounting surface of the metal block in the plan view project from a center part of the device mounting surface.

10. The stem for the semiconductor package as claimed in claim 3, wherein both ends of the device mounting surface of the metal block in the plan view project from a center part of the device mounting surface.

11. The stem for the semiconductor package as claimed in claim 4, wherein both ends of the device mounting surface of the metal block in the plan view project from a center part of the device mounting surface.

12. The stem for the semiconductor package as claimed in claim 5, wherein both ends of the device mounting surface of the metal block in the plan view project from a center part of the device mounting surface.

13. A semiconductor package comprising:
the stem for the semiconductor package according to claim 1; and
the semiconductor device mounted on the device mounting surface.

14. A semiconductor package comprising:
the stem for the semiconductor package according to claim 2; and
the semiconductor device mounted on the device mounting surface.

15. A semiconductor package comprising:
the stem for the semiconductor package according to claim 3; and
the semiconductor device mounted on the device mounting surface.

16. A semiconductor package comprising:
the stem for the semiconductor package according to claim 4; and
the semiconductor device mounted on the device mounting surface.

17. A semiconductor package comprising:
the stem for the semiconductor package according to claim 5; and
the semiconductor device mounted on the device mounting surface.

18. A semiconductor package comprising:
the stem for the semiconductor package according to claim 8; and
the semiconductor device mounted on the device mounting surface.

19. The stem for the semiconductor package as claimed in claim 1, wherein the metal base and the metal block are in direct contact with each other.

20. The stem for the semiconductor package as claimed in claim 1, wherein an entirety of the surface at the first end of the metal block coincides with an entirety of the second surface of the eyelet.

* * * * *